United States Patent [19]

Lukso

[11] 4,371,978
[45] Feb. 1, 1983

[54] AUTOMATIC TUNING SYSTEM
[75] Inventor: Richard J. Lukso, Tucson, Ariz.
[73] Assignee: Jet Electronics and Technology Incorporated, Grand Rapids, Mich.
[21] Appl. No.: 256,170
[22] Filed: Apr. 21, 1981

Related U.S. Application Data

[63] Continuation-in-part of Ser. No. 103,430, Dec. 14, 1979, abandoned.
[51] Int. Cl.³ .............................................. H04B 1/38
[52] U.S. Cl. .................................. 455/77; 455/151; 455/158; 455/184; 455/185
[58] Field of Search ............... 455/77, 150, 151, 153, 455/156, 158, 176, 180, 184-186; 340/825.71, 825.76

[56] References Cited

U.S. PATENT DOCUMENTS 3,701,945 10/1972 Gallant et al. ...................... 455/77
3,940,702  2/1976 Yoshimura ........................ 455/186
3,962,644  6/1976 Baker ............................... 455/165

*Primary Examiner*—Jin F. Ng
*Attorney, Agent, or Firm*—Price, Heneveld, Huizenga & Cooper

[57] ABSTRACT

An automatic tuning system for controlling the avionics in an aircraft includes an operator actuated keyboard for entering any available frequency for the many avionic receiver/transmitters and/or transponders employed in the aircraft. Signals from the keyboard are applied to a microprocessor programmed to detect first a valid frequency selection for one of the instruments aboard the aircraft and provide control output signals which are converted to a data format for tuning the device to which the selected frequency applies to the frequency selected. Such a system eliminates the need for the pilot or other operator to individually tune a particular device since it is necessary only to enter a desired frequency with a control signal being automatically applied to tune the electronic unit to which the selected frequency corresponds.

27 Claims, 8 Drawing Figures

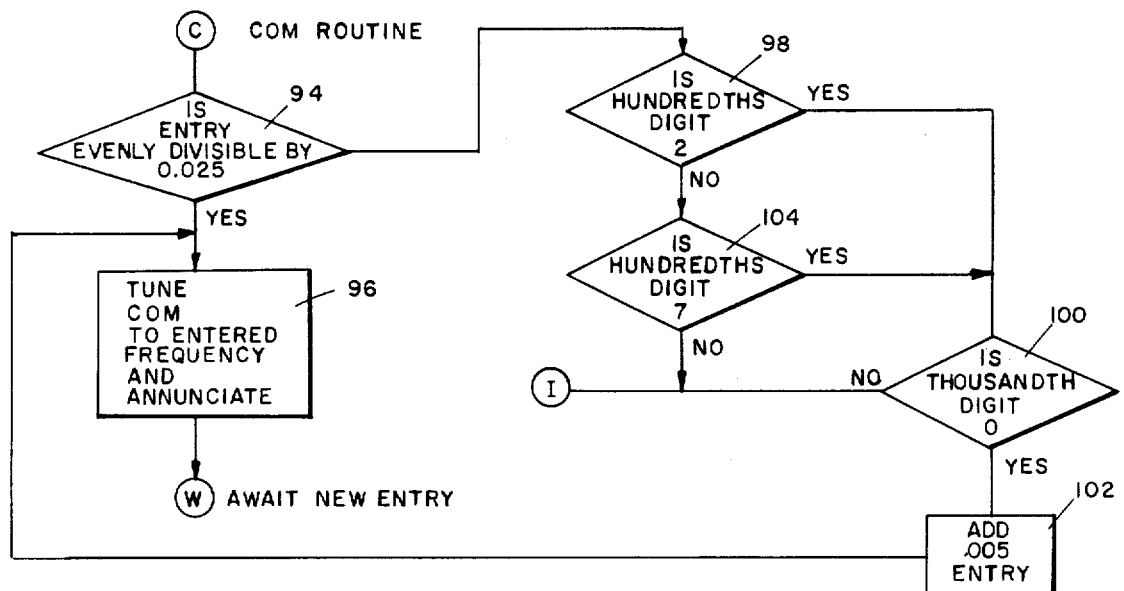
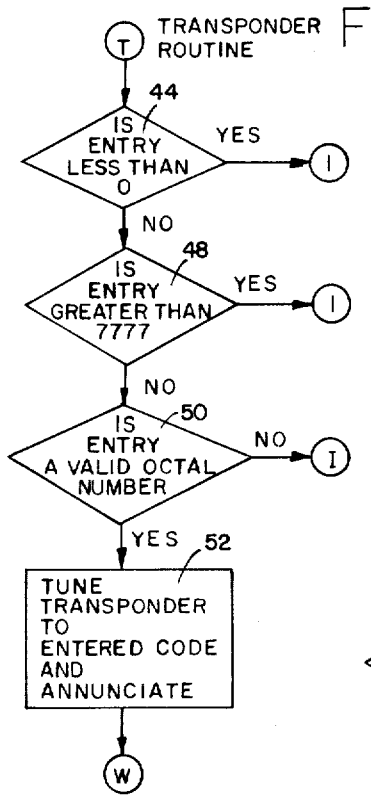
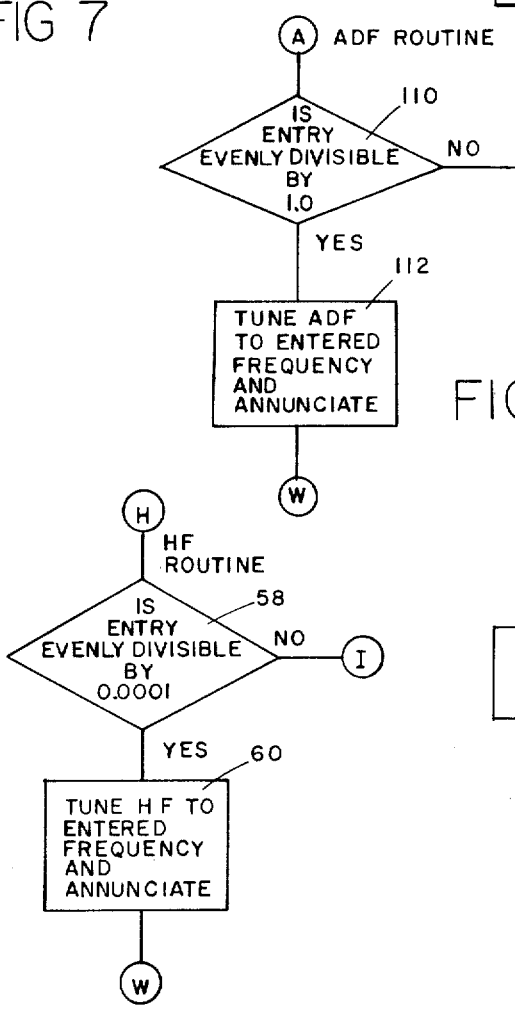
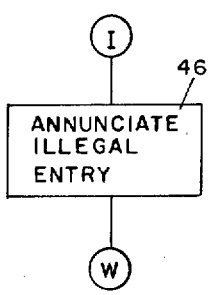

AUTOMATIC TUNING SYSTEM

This is a continuation of application Ser. No. 103,430, filed Dec. 14, 1979, now abandoned.

BACKGROUND OF THE INVENTION

The present invention relates to a control system for controlling the frequency of operation of aircraft radio communication and navigational apparatus.

Modern aircraft are equipped with a multitude of navigational and communication transmitters, receivers and transponders, all of which must be tuned to specific frequencies in specific areas of travel for operation. In the past, each electronic unit included its own frequency controlling means such as dials, switches, or the like which the operator of the aircraft had to individually control. Improvements over such manual tuning systems have been made where, for example, as disclosed in U.S. Pat. No. 3,701,945 issued Oct. 31, 1972, a system is provided in which a keyboard is provided for entering the desired frequency into the control system for each of the various avionics involved. This system, however, requires not only the frequency selection but also that the operator select the instrument being tuned by the frequency entered. Other prior art patents disclose a variety of methods of tuning avionic receivers or transmitters using digital controls and/or for storing information pertaining to selected frequencies. Representative of such prior art are U.S. Pat. Nos. 4,075,567; 4,119,915; and 4,122,395.

SUMMARY OF THE PRESENT INVENTION

The system of the present invention provides a single step tuning control system and method by which the operator enters a frequency for any of the many receiver/transmitters of the aircraft and signals representative of such frequency are correlated with stored data identifying all available frequencies and if a valid frequency has been selected, a control output signal is provided to automatically tune the device to which the selected frequency pertains. Systems embodying the present invention include a data entry means such as a keyboard coupled to a microprocessor programmed to test the entered frequency against all available frequencies for devices in the aircraft and provide control output signals if a valid frequency has been entered by the operator. The control output signals are employed for the automatic tuning of a device to the selected frequency. An illegal entry display is provided to alert the operator in the event an erroneous frequency is entered.

Thus, the system of the present invention provides a single step tuning process for the many avionic receiver/transmitters of an aircraft thereby simplifying the tuning process for the aircraft operator. Further, the system prevents mistuning of any of the avionics. These and other features, advantages and objects of the present invention can best be understood by reference to the following description thereof together with the accompanying drawings in which:

BRIEF DESCRIPTION OF THE DRAWINGS

FIGS. 2-8 are flow diagrams of the programming for the microprocessor shown in FIG. 1.

DETAILED DESCRIPTION OF THE PREFERRED EMBODIMENT

Figure 1:
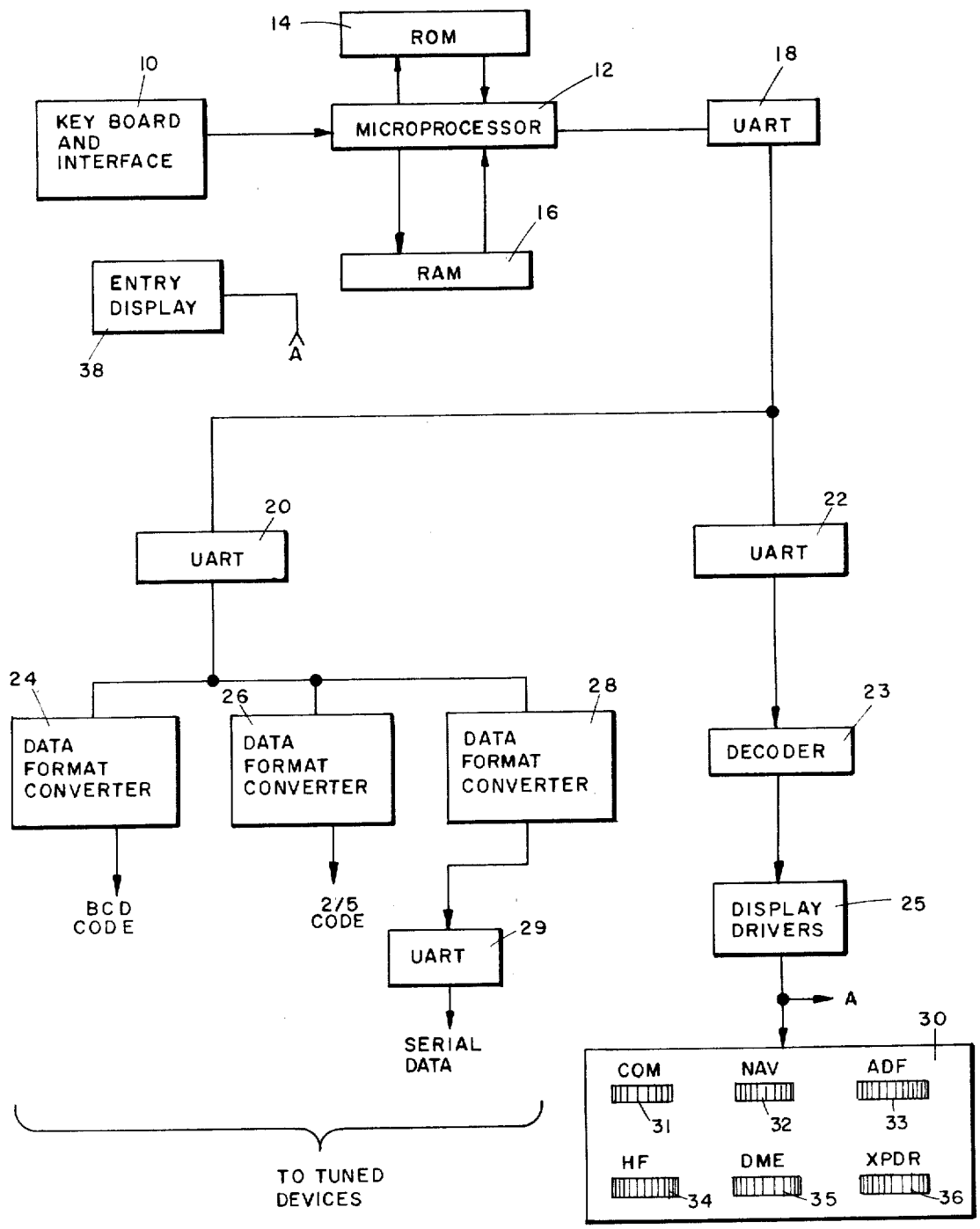
FIG. 1 is an electrical circuit diagram in block form of the system embodying the present invention.

Referring initially to FIG. 1 there is shown an electrical control system for use in practicing the preferred embodiment of the invention. The system includes a conventional digital keyboard and interface circuit 10, the latter of which may comprise, for example, a commercially available National Semiconductor encoder type 54C922 which is coupled to interface with a microprocessor 12 such as an Intel 8080. The microprocessor is intercoupled with a ROM memory 14 such as commercially available 2716 or 2708 integrated circuit chips which are programmed with the control program. Temporary storage for data is provided in a RAM memory 16 also coupled to the microprocessor. RAM memory 16 may comprise, for example, commercially available 2102 integrated circuit chips.

Output signals from microprocessor 12 are applied to a UART 18 such as a National MM5305 for converting the parallel data therefrom into a serial format. Serial data from UART 18 is transmitted to a pair of additional UARTS 20 and 22 which convert the serial data to parallel 8 bit output words applied to data format convertor units 24, 26 and 28 associated with UART 20 and to a display 30 associated with UART 22. The parallel data from UART 22 is applied to a decoder 23 for converting the data into a suitable display data format which signals are then applied to display drivers 25 and subsequently to a display unit 30 and an entry display 38 (through interconnection A) positioned physically adjacent keyboard 10 permitting the operator to monitor the entry of numerical data corresponding to a selected frequency. The display unit 30 comprises an array of individual digital displays corresponding to the particular avionics used by the aircraft. Thus, for example, display 31 can be a six digit high intensity filament-type digital display (as are the remaining displays) for the communication frequency which falls within the frequency range of 118 to 135.975 MHz tunable in 25 KHz increments. Display 32, for the navigational frequencies such as LOC/VOR, can be a five digit display covering the navigational frequency band of 108 to 117.95 MHz. Display 33 comprises a four digit display for the ADF, tunable within a range of 200 to 1799 KHz. Display 34 is a six digit display for the high frequency band, tunable between 2 to 29.9999 MHz, tunable in 100 Hz increments. Display 35 can be a two digit display for displaying the DME channel associated with the navigational frequency selected as described in greater detail below. Finally, display 36 for the transponder comprises a four digit display for displaying the transponder code.

The data format converting circuits 24, 26 and 28 comprise commercially available circuit elements such as integrated circuit chips 74S288 or other standard T²L or CMOS logic circuits for converting the parallel 8 bit words from UART 20 to a BCD code, a two out of five code, or to serial data through a UART 29 for circuits 24, 26 and 28 respectively to provide a control command signal having a format suitable for automatically controlled avionic receivers/transmitters. The BCD code, two out of five code, and serial data from UART 29 are the standard data formats employed by commercially available avionic devices such as communication receivers, transponders, ADF receiver/transmitters and the like manufactured by Collins Radio, King, or RCA Corporation. These receiver/transmitters are specifically designed to accept the particular data format and respond thereto to tune the device to the selected frequency defined by the control command input. In FIG. 1 only three such data converting circuits are shown, it being understood that depending on the number of tuned devices being controlled, a greater or fewer number can be provided.

Naturally, keyboard 10 is located at a convenient position in the cockpit of the airplane as are displays 30 and 38 such that the pilot can select a desired frequency and monitor the display 30 as desired. In the event a frequency is entered which does not correspond to one of the permitted frequencies, display 38 will flash indicating that a frequency entered by the pilot is not a permitted frequency for any of the receivers/transmitters. Alternatively, other alarm means, either visual or acoustical can be provided to indicate to the pilot that a nonpermitted frequency has been entered at the keyboard. Having described the hardware comprising the system of the present invention, a description of the ROM programming for microprocessor 12 to achieve the comparison of the entered frequency signals from keyboard 10 with stored data testing for permitted frequencies and for generating the desired command control signals for tuning the aircraft receiver/transmitters is now presented in conjunction with FIGS. 2-8.

Figure 2:
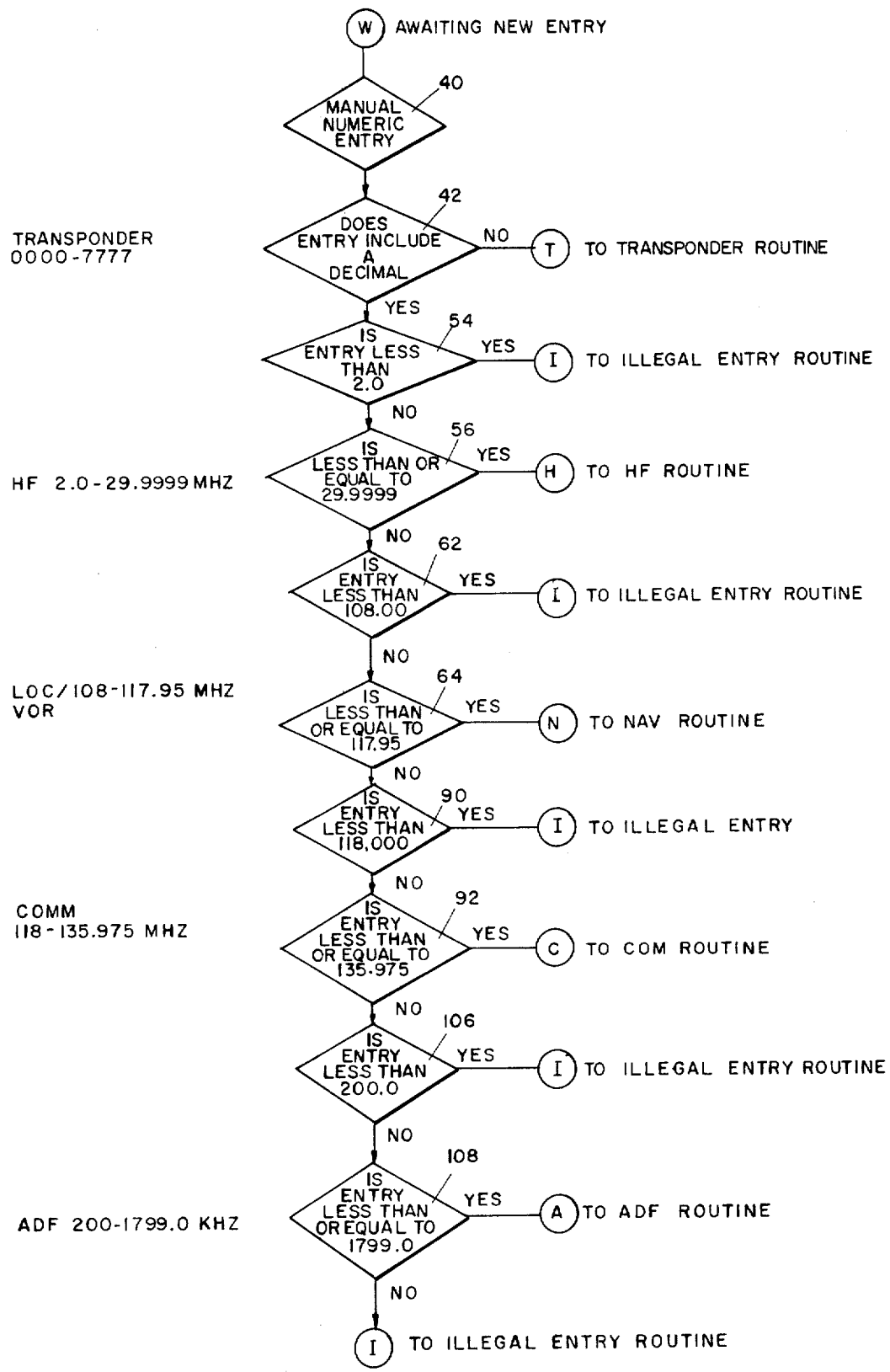
Figure 6:
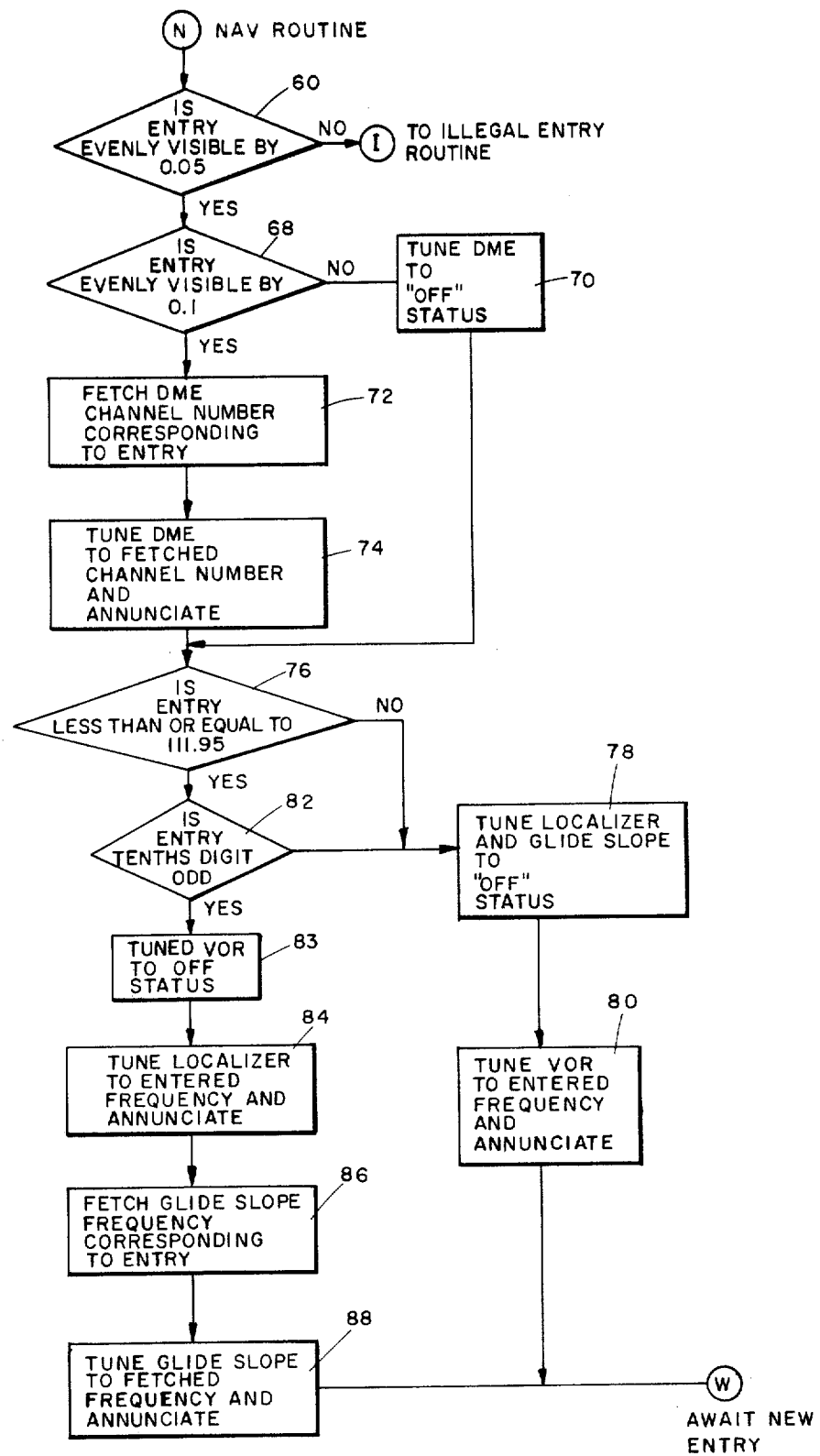

Referring initially to FIG. 2 which shows the basic program flow diagram, the microprocessor after initialization is awaiting a new entry as indicated by the encircled W entry point. A desired frequency for one of the avionic systems is entered by the pilot using keyboard 10 by entering the sequential numbers for the frequency and a decimal point either at the end or where it might otherwise occur in the frequency (except for the transponder) and activating an enter key as indicated by block 40 in FIG. 2. The first decisional block 42 tests the entered number to ascertain if it includes a decimal point. All frequencies with the exception of the transponder which includes numbers 0000–7777 are entered using a decimal point either within the frequency or at the end thereof. Thus, if no decimal point is detected, the program goes to the transponder routine as indicated by entry point T. FIG. 3 shows the details of the transponder routine. In the transponder subroutine, the microprocessor programs and checks the entered number to see if it is less than 0 as indicated by block 44. If it is a negative number, then a mistake has been made and the program goes to the illegal entry routine indicated as block 46 in FIG. 4. The illegal entry point I enunciates the illegal entry as indicated by block 46 which causes the entry display 38 to flash thereby indicating to the operator that a numerical entry has been made which does not correspond to any of the frequencies available on the receiver/transmitters of the aircraft. Once the illegal entry has been annunciated, the program returns to the awaiting new entry.

If the entry without a decimal is greater or equal to 0, the transponder routine shown in FIG. 3 is continued by decisional block 48 in which the number is tested against the number 7777 to ascertain if the number entered is, in fact, a transponder code. If the number is greater than 7777, again the program returns to the illegal entry routine shown in FIG. 4. If not, the program proceeds to decisional block 50 to test to see if it is a valid octal number for the transponder. If not, the program proceeds to the illegal entry routine but if a valid octal number, it continues to the transponder tuning block 52 corresponding to the generation of a command control signal for tuning the transponder receiver/transmitter while simultaneously providing a signal to the display 36 to cause the display of the entered number. Thus, the microprocessor provides output control signals applied to UARTS 18, 20 and 22 to the respective logic circuits for providing a control signal to the transponder for automatically tuning to the set code and for providing a display of the transponder code by display 36.

Once this is done the program returns to the awaiting new entry point and assuming that a different transponder code is not selected, but that the pilot enters a frequency for the HF receiver/transmitter, the next decisional block 54 in FIG. 2 is a test to see if the entered number is less than 2.0.

If the entered number is less than 2.0, there is no frequency band corresponding to this number and as before, the program proceeds to the illegal entry routine. If it is greater than 2.0 as indicated by the next test, decisional block 56 is to ascertain whether or not the number entered is less than or equal to 29.9999. The tests indicated by blocks 54 and 56 thereby determine whether or not the frequency entered falls within the high frequency band of 2 to 29.9999 MHz. If it does, the program proceeds from block 56 to the high frequency routine shown in FIG. 5.

Since the frequencies available for the high frequency band are in 100 Hz increments, a test indicated by decisional block 58 is conducted on the entry to ascertain whether it is evenly divisible by 0.0001. If it is not, it indicates that the entered number is an illegal entry and the program proceeds to the illegal entry routine of FIG. 4. If, however, the entered frequency lies between 2 and 29.9999 and is evenly divisible by 0.0001, it indicates that a valid high frequency has been entered by the pilot and the resultant control signal is generated as indicated by block 60 to tune the high frequency receiver/transmitter and provide a signal annunciating the selected frequency on the high frequency display 34 shown in FIG. 1.

After this is completed, the program recycles to the awaiting new entry block and assuming that neither a transponder or high frequency is next selected by the operator, the program cycles to the next decisional block 62 which tests to see if the entered number is less than 108.00.

If the entered number is less than 108.00 and greater than 29.9999, it is not a valid frequency for any of the avionics on the aircraft. Thus, if it falls within this number range the program proceeds to the illegal entry routine. If, however, it is greater than 108.00 then it proceeds to the next decisional block 64 in which the entered number is compared with stored data to ascertain whether or not the frequency is less than or equal to 117.95. Thus, the effect of blocks 62 and 64 is to ascertain the existence of a selected LOC/VOR frequency lying within the frequency band of 108 to 117.95 MHz. If the number entered falls within this frequency bank, the program proceeds to the navigational routine indicated by the N and shown in detail in FIG. 6.

In the navigation routine the first decision block 66 tests the entry first to ascertain whether or not its evenly divisible by 0.05. Each of the navigational frequencies will, in fact, be so divisible and if not, the program actuates the illegal entry routine annunciator shown in FIG. 4. If the entry is divisible by 0.05, then it is further tested to find out if it is evenly divisible by 0.1 as indicated by decisional block 68 in FIG. 6. This further test is to ascertain whether or not one of the DME frequencies has been selected. If not, the DME receiver is turned off as indicated by block 70 in FIG. 6 and the program proceeds to block 76.

If a navigational frequency has been selected in which a DME signal is transmitted, it will be evenly divisible by 0.1 and the program proceeds to block 72 in which the DME channel number corresponding to the entered frequency is obtained from the channel number correlation stored in the ROM memory 14 (FIG. 1). Further, as indicated by block 74, the DME is tuned to the desired channel and the channel number annunciated by DME display 35 after which a test is run to ascertain whether or not the frequency entered is less than or equal to 111.95 as indicated by decisional block 76. This test is run to ascertain whether or not an ILS frequency has been selected and if it has not, the localizer and glide slope receivers are turned off as indicated by block 78 while the VOR is tuned to the entered frequency (block 80) and annunciated by display 32 (FIG. 1) and the system returns to await a new entry.

If, however, a navigational frequency is selected in which a localizer and glide slope frequency exists, the decision in block 76 is that a frequency is less than or equal to 111.95 and the test indicated by block 82 is run to ascertain whether the entered frequency has a tenth's digit which is odd. If not, the function of blocks 78 and 80 are run. If the test of block 82 is positive indicating that the frequency corresponds to one with a localizer and glide slope transmission, as indicated by block 83, the VOR receiver is tuned to an off status since a VOR frequency has not been entered but a localizer frequency has been entered by the pilot. The localizer frequency is then entered and annunciated as indicated by block 84 while the corresponding glide slope frequency is determined as indicated by block 86, the glide slope receiver is tuned and the frequency annunciated as indicated by block 88 after which the program returns to await the new entry.

If a navigational frequency has not been entered and the proceeding tests 54, 56, 62 and 64 of the flow chart of FIG. 2 have all been negative, the program proceeds to decisional block 90 where the entered number is compared with a stored reference number to see if it is less than 118.000. If it is, the program proceeds to the illegal entry routine and if not, a further check is made as indicated by decisional block 92 to ascertain if the frequency entered is less than or equal to 135.975 MHZz. The test to this point thus ascertains whether or not a communication frequency within the band of 118 to 135.975 MHz has been entered. If it has, the program proceeds to the communications routine indicated by the encircled C which is shown in detail in FIG. 7.

In the communication routine the entered information is checked to see if it is evenly divisible by 0.025 as indicated by decisional block 94. Since the communication frequencies are all increments of 25 KHz, if a communication frequency has been entered, it will be evenly divisible by 0.025 and the communication receiver will be tuned as indicated by block 96 and annunciated by display 31 (FIG. 1) with the program then returning to await a new entry. If, however, the number is not evenly divisible by 0.025, a further test is conducted as indicated by block 98 to ascertain if the hundredths digit is 2. The function of the further test is to permit the pilot to enter as part of a valid communication frequency only the tenths or hundredths least significant digits to achieve the correct frequency. Thus, the decisional block 98 checks to see if the hundredths digit is a 2 and if it is, it checks the thousandths digit to ascertain if it is a 0. If it is a 0, and all the remaining less significant digits are 0, the system automatically adds 0.005 to the entered frequency as indicated by block 102 and the communication receiver/transmitter is tuned to the resultant frequency as indicated by block 96.

If the pilot entered hundredths digit is not a 2, a check is made to see if the hundredths digit is a seven and if it is, again the test indicated by block 100 is conducted to ascertain if the thousandths digits and those to the right are zeroes. If so, 0.005 is again added to the entered frequency and the resultant frequency entered to the tuning block 96. If, as indicated by block 104, the hundredths digit is not a seven, then an illegal entry has been made and the program annunciates an illegal entry by flashing the enter display 38 (FIG. 1) as shown by the subroutine of FIG. 4.

If none of the above tests have been met, the system next checks to see if the entry is less than 200.0 as indicated by block 106. If it is, then there are no frequencies remaining corresponding to a valid entry and the system goes to the illegal entry routine. If the entered frequency is greater than 200, a further test is made as indicated by decisional block 108 to ascertain whether or not the entered frequency is less than or equal to 1799.0 which provides a check to see if the frequency falls within the 200 to 1799.0 KHz frequency band corresponding to the ADF frequency allocation. If it is, the program proceeds to the ADF routine shown in FIG. 8 where the entered number is checked as indicated by decisional block 110 to see if it is evenly divisible by 1. If not, the program proceeds to the illegal entry routine. If it is, however, the frequency entered corresponds to a valid ADF frequency and the ADF receiver is tuned and the frequency annunciated by display 33 (FIG. 1) as indicated by block 112. After the ADF receiver is tuned and the frequency annunciated, the system returns to await a new keyboard entry.

Thus, the system of the present invention provides a series of digital tests on the data corresponding to the entered frequency to ascertain which assigned band the entered frequency corresponds to. If the frequency falls within a given band but is not a valid frequency within the bandwidth, or does not fall within an assigned frequency band, an alarm to the pilot indicates that an improper frequency has been selected and no control signal is generated to tune the receivers/transmitters. This prevents mistuning of any of the avionics of the aircraft. Further, the system automatically scans through the available frequencies to ascertain which of the avionic units are to be tuned and provides control signals for automatically tuning the same together with display signals indicating to the pilot that the unit has been tuned to such frequency.

It will become apparent to those skilled in the art that the particular tests conducted and the arrangement of such tests in the system of the preferred embodiment can be varied. If the avionic frequency bands or individual frequencies within such bands are changed by F.C.C. regulations, naturally the test comparisons can be modified to verify the entry of a valid frequency. These and other modifications can be made by those skilled in the art without departing from the spirit or scope of the present invention as defined by the appended claims.

The embodiments of the invention in which an exclusive property or privilege is claimed are defined as follows:

1. A system for providing tuning control signals for automatically controlling the tuning of a plurality of independent simultaneously operable avionic transceivers each of which is assigned a predetermined frequency spectrum mutually exclusive of the frequency spectra of the other transceivers comprising:

data entry means permitting an operator to enter a desired frequency and responsive to such entry for providing signals identifying the desired frequency; and circuit means coupled to said data entry means for comparing the signals therefrom with stored data defining the frequency spectra associated with the plurality of avionic transceivers and for providing control output signals for tuning the one of said avionic transceivers assigned the frequency spectrum within which the desired frequency lies to the entered frequency without changing the tuning of the avionic transceivers having frequency spectra within which the desired frequency does not lie.

2. The system as defined in claim 1 and further including display means coupled to said circuit means for displaying the frequency to which a transceiver is tuned.

3. The system as defined in claim 2 wherein said data entry means includes a numerical keyboard.

4. The system as defined in claim 3 wherein said circuit means includes a microprocessor and associated memory circuit means programmed for comparing signals from said keyboard with stored frequency limit data to ascertain if an entered frequency falls within a valid frequency spectrum for the transceivers.

5. The system as defined in claim 4 and further including means coupled to said microprocessor for providing an alarm signal to the operator in the event an entered frequency does not fall within a permitted frequency allocation for the transceivers.

6. The system as defined in claim 5 and further including data format converting means and means for coupling said data format converting means to said microprocessor for providing control output signals in a format compatible with the transcievers.

7. The system as defined in claim 6 wherein said display means include a separate digital display for each transceiver and an entry digital display proximate to said keyboard.

8. A method of providing control signals for automatically tuning a plurality of simultaneously operable avionic transceivers comprising the steps of:

providing signals representing a desired tuning frequency of a transceiver;

providing memory means containing test criteria to identify mutually exclusive frequency sets assigned each avionic transceiver; and correlating the desired frequency signals with the test criteria and providing control output signals for tuning the one of said avionic transceivers assigned the frequency set within which the desired frequency lies to the desired frequency without changing the tuning of the avionic transceivers assigned frequency sets within which the desired frequency does not lie.

9. The method as defined in claim 8 wherein said first named providing step comprises the generation of data signals by an operator actuated keyboard.

10. The method as defined in claim 9 wherein said second named providing step comprises the storage of information defining the frequency limits for each frequency set for each transceiver.

11. The method as defined in claim 10 wherein said correlating step comprises sequentially comparing data signals from said keyboard with stored information to determine to which transceiver the keyboard entered data pertains.

12. The method as defined in claim 11 wherein said correlating step comprises the further step of testing data signals from the keyboard to ascertain if said data signals represent a valid frequency within a frequency set assigned to a transceiver.

13. The method as defined in claim 12 and further including the step of providing an alarm when data signals are generated which represent a frequency which is not a valid frequency for any of the transceivers.

14. The method as defined in claim 13 and further including the step of displaying the frequency represented by the generated data signals to the operator.

15. An electrical circuit for controlling the tuning of a plurality of simultaneously operable avionic transceivers comprising:

a single keyboard permitting an operator to enter a frequency associated with an avionic transceiver and for providing signals representative of the entered frequency; and a microprocessor and memory circuit means, said microprocessor coupled to said keyboard and programmed for testing the signals therefrom to ascertain to which transceiver the entered frequency corresponds and for providing control output signals for tuning the transceiver to the entered frequency without changing the frequency of the other avionic transceivers.

16. The system as defined in claim 15 and further including means for indicating to the operator when an entered frequency is not a valid frequency.

17. The system as defined in claim 16 and further including display means coupled to said microprocessor for displaying the frequency to which a transceiver is tuned.

18. The system as defined in claim 17 and further including data format converting means coupled to said microprocessor for providing output signals in response to said control output signals in a data format accepted by individual transceivers.

19. An automatic tuning system for a plurality of independent simultaneously operable aircraft receiver/transmitters comprising:

a numerical entry digital keyboard permitting an operator to enter a desired frequency therein;

a microprocessor and interface circuit means coupling said microprocessor to said keyboard;

memory circuit means coupled to said microprocessor and programmed to correlate frequency representative signals from said keyboard with stored frequency limit data defining the valid frequency bands used by the aircraft receiver/transmitters being controlled and for providing frequency control signals to the receiver/transmitter to which the entered frequency corresponds when a valid frequency is entered at said keyboard without changing the tuning of receiver/transmitters to which the entered frequency does not correspond; and display means coupled to said microprocessor for displaying the entered frequency.

20. The system as defined in claim 19 wherein said microprocessor provides an alarm signal when a non-valid frequency has been entered at the keyboard.

21. A system for providing tuning control signals for automatically controlling the tuning of a plurality of simultaneously operable avionic transceivers each of which is assigned a predetermined frequency set mutually exclusive of the other transceivers' frequency sets comprising:

data entry means permitting an operator to enter a desired frequency and for providing signals identifying the desired frequency;

circuit means coupled to said data entry means for comparing the signals therefrom with stored data defining the frequency sets associated with the plurality of transceivers and for providing frequency controlling output signals for selectively tuning the transceiver assigned the frequency set within which the desired frequency lies to the entered frequency without changing the tuning of the other transceivers; and a plurality of output means, each coupled to said circuit means for coupling said control output signals to the plurality of transceivers.

22. The system as defined in claim 21 and further including display means coupled to said circuit means for displaying the frequency to which a transceiver is tuned.

23. The system as defined in claim 22 wherein said data entry means includes a numerical keyboard.

24. The system as defined in claim 23 wherein said circuit means includes a microprocessor and associated memory circuit means programmed for comparing signals from said keyboard with stored frequency limit data to ascertain if an entered frequency falls within a valid frequency band for the transceivers.

25. The system as defined in claim 24 and further including means coupled to said microprocessor for providing an alarm signal to the operator in the event an entered frequency does not fall within a permitted frequency allocation for the transceivers.

26. The system as defined in claim 25 and further including data format converting means and means for coupling said data format converting means to said microprocessor for providing control output signals in a format compatible with the transceivers.

27. The system as defined in claim 26 wherein said display means include a separate digital display for each transceiver and an entry digital display proximate to said keyboard.

* * * * *